(12) United States Patent
Mesch et al.

(10) Patent No.: US 11,655,649 B2
(45) Date of Patent: May 23, 2023

(54) PUBLIC SERVICE CABINET WITH MODULAR EXPANSION FACILITY FOR A STREET MAST

(71) Applicants: Lightwell B.V., Amsterdam (NL); Gemeente Rotterdam, Rotterdam (NL)

(72) Inventors: Florian Mesch, Rotterdam (NL); Jan Pieter Wijnands, Gouda (NL)

(73) Assignees: Lightwell B.V., Amsterdam (NL); Gemeente Rotterdam, Rotterdam (NL)

( * ) Notice: Subject to any disclaimer, the term of this patent is extended or adjusted under 35 U.S.C. 154(b) by 0 days.

(21) Appl. No.: 17/774,526

(22) PCT Filed: Nov. 5, 2020

(86) PCT No.: PCT/EP2020/081158
§ 371 (c)(1),
(2) Date: May 5, 2022

(87) PCT Pub. No.: WO2021/089712
PCT Pub. Date: May 14, 2021

(65) Prior Publication Data
US 2022/0349202 A1 Nov. 3, 2022

(30) Foreign Application Priority Data
Nov. 8, 2019 (NL) .................................. 2024195

(51) Int. Cl.
*H02G 3/04* (2006.01)
*E04H 12/00* (2006.01)
(Continued)

(52) U.S. Cl.
CPC ......... *E04H 12/003* (2013.01); *H02G 3/0493* (2013.01); *H02G 3/083* (2013.01); *F21S 8/085* (2013.01)

(58) Field of Classification Search
CPC .......... H02G 3/08; H02G 9/02; H02G 3/0493; H02G 3/083; H02G 3/086; H02G 3/081;
(Continued)

(56) References Cited

U.S. PATENT DOCUMENTS 3,373,276 A * 3/1968 Klein ..................... F21V 21/10
174/45 R
6,486,399 B1 * 11/2002 Armstrong ........... H05K 5/0204
439/535
(Continued)

FOREIGN PATENT DOCUMENTS

GB 2557567 A 6/2018
KR 10-2008-0051901 A 6/2008
(Continued)

OTHER PUBLICATIONS

International Application No. PCT/EP2020/081158, International Search Report and Written Opinion, dated Feb. 1, 2021, 14 pages.

*Primary Examiner* — Angel R Estrada
(74) *Attorney, Agent, or Firm* — Hoffmann & Baron, LLP (57) ABSTRACT

A public service cabinet includes a foundation support, a connection frame, and housing parts that delimit internal spaces for receiving electrical and/or communication/control equipment. The foundation support includes a first street mast module of which an upper end is configured to be connectable to a lower end of a second street mast module of a modular street mast. The connection frame is releasably connected to the first street mast module, and the housing parts extend to a height that lies above a height to which the first street mast module extends such that at least an upper portion of the first street mast module is surrounded by the housing parts. A removable first-type cover is provided that is configured to shield of an upper side of the cabinet including the upper end of the first street mast module.

15 Claims, 4 Drawing Sheets

(51) Int. Cl.
*H02G 3/08* (2006.01)
*F21S 8/08* (2006.01)

(58) Field of Classification Search
CPC .. H02G 3/04; H05K 5/00; H05K 5/02; H05K 5/0204; F21V 23/023; F21S 8/08; F21S 8/085; E04H 12/22; E04H 12/2269; E04H 12/003; E04H 12/2253; H02B 1/50

USPC ....... 174/45 R, 50, 493, 504, 505, 535, 559, 174/560, 60, 68.1, 68.3, 58, 38; 220/3.2, 220/3.3, 3.9, 4.02; 312/237, 223.1, 312/223.6; 248/218.4, 219.1, 219.3; 361/600, 601, 724, 752; 52/292, 296, 52/835

See application file for complete search history.

(56) References Cited

U.S. PATENT DOCUMENTS

| | | | | |
|---|---|---|---|---|
| 6,969,034 | B2* | 11/2005 | Ware | H01G 2/04 |
| | | | | 248/230.9 |
| 7,765,770 | B2* | 8/2010 | Fournier | E04H 12/2253 |
| | | | | 52/843 |
| 7,851,702 | B2* | 12/2010 | Fournier | H02G 3/081 |
| | | | | 174/559 |
| 10,988,954 | B2* | 4/2021 | Ducros | H05K 7/18 |
| 11,355,904 | B1* | 6/2022 | Bronson | H02G 7/20 |
| 2005/0029419 | A1 | 2/2005 | Ware et al. | |

FOREIGN PATENT DOCUMENTS

WO 2008/086607 A1 7/2008
WO 2019/043046 A1 3/2019

* cited by examiner

PUBLIC SERVICE CABINET WITH MODULAR EXPANSION FACILITY FOR A STREET MAST

CROSS-REFERENCE TO RELATED APPLICATIONS

This application is the National Stage of International Application No. PCT/EP2020/081158, filed Nov. 5, 2020, which claims the benefit of Netherlands Application No. 2024195, filed Nov. 8, 2019, the contents of which is incorporated by reference herein.

FIELD OF THE INVENTION

The invention relates to public service cabinets that comprise a housing inside which some specific electrical and/or communication/control equipment is housed, in particular one or more plug-in charging modules for electric vehicles, like cars and/or bicycles.

BACKGROUND TO THE INVENTION

Such public service cabinets are known in a wide variety of different embodiments, and mostly have typically column-shaped housings. Nowadays more and more of such cabinets are placed in the public domain. Specifically the charging-type cabinets are placed in large numbers at parking places and alongside streets, in order to provide service for the rapidly growing number of electric vehicles that all need to be frequently charged.

This however also places a burden on local authorities and decision makers because they have a responsibility to take good care of the public area such that all inhabitants can keep on making well use of it while at a same time the environment is take care of. At a lot of places, in particular in crowded cities, space is already limited and it is difficult to predict which other actions relating to street furniture may become necessary in the future.

It is therefore an important aim of such authorities and decision makers to maintain being as flexible as possible, and only have new obstacles formed in the public area where it is absolutely necessary.

For the placing of the service cabinets they now only have a limited number of options available, either have them placed as stand-alone units either have them built-around already present street masts, like ones of streetlamps. For the stand-alone cabinets it goes that they can be placed wherever one wants but that they need to be firmly founded to the ground by themselves while also getting connected to a public electricity grid and communication provision. For the ones that need to get integrated into or built around bottom sections of already existing street masts it goes that they do not their own foundation, but that they can simply be connected to the mast, and thus profit from the already present foundation of the street mast itself.

For example WO-2008/086607 shows a built-around service cabinet that can be used around an existing street mast, like a mast of a streetlamp or a mast of any other upstanding street furniture, that is mounted on a concrete base or mounted over a metallic base that is buried in the ground, or that has a belowground bottom section inserted into the ground for forming a foundation pole. The cabinet comprises a frame that has at least two complementary parts that are connectable together as well as to an aboveground bottom section of the street mast. The frame generally defines a vertically extending internal passage for enclosing the bottom section of the street mast. Circumferential side wall housing parts are connected to the frame and delimit a number of internal spaces between the mast and themselves. Each of the spaces is accessible via a lockable access door. The spaces may for example house electrical and/or communications equipment related to power distribution and/or communication networks, for which connections with electricity and/or communication ground cables need to be made.

A disadvantage of both the stand-alone type as well as of the built-around type is that their flexibility in use leaves to be desired. Once they are founded by themselves to the ground or once they are built around existing street masts, they place true limitations on the local authorities and decision makers when making further plans for the future. Either the stand-alone cabinets have gotten to form new obstacles in the public area and thus may stand in the way of other street furniture to be place at or near them, either the built-around cabinets are destined to keep on being used in combination with the mostly much earlier chosen and possibly already somewhat outdated type of already present street masts.

Another disadvantage is that for the built-around already present street masts service cabinets it may be difficult and time-consuming to have maintenance or other operations performed to the masts themselves. If for example a damaged mast needs to be repaired or replaced for a new one, then it may be necessary to first fully disassemble and remove the cabinet from around the mast, then remove the mast, have it repaired or replaced by a new mast, and after that built the cabinet around it again.

A same labour-intensive and time-consuming operation also shall occur when it is for example desired to have outdated types of masts somewhere in the future replaced for modernized new "smart city" type masts. This for example may be desired because of technical innovations that are aimed to build into or added to street masts, like for example ones that aim to make all kinds of city service facilities smarter in their control options and for that are to be equipped with all kinds of sensors, camera's, communication provisions, connections to control rooms, the internet, etc. It then might well be the case that the newly developed street masts no longer complement with the present type of cabinet. For example they may need another dimensioned vertically extending internal passage inside their frame, may need other kinds of connectors, may need other kinds of housing parts, etc. In that case also the cabinets themselves shall need to be replaced for properly complementary fitting other ones. This however shall bring along considerable additional costs for the authority that initially merely had an intention to replace the older masts for modernized new "smart city" masts.

BRIEF DESCRIPTION OF THE INVENTION

The present invention aims to overcome those disadvantages at least partly or to provide a usable alternative. In particular the present invention aims to provide a public service cabinet that is able to offer great flexibility for future amendments to be made in public areas.

This aim is achieved by a public service cabinet according to the present invention. This public service cabinet comprises a foundation support that is configured to be founded to the ground, a connection frame that is connected with the foundation support, and housing parts that are connected with the connection frame, wherein the housing parts delimit one or more internal spaces for receiving electrical and/or communication/control equipment. According to the inventive thought the foundation support already comprises a first street mast module of which an upper end is configured to be connectable to a lower end of a second module of a modular street mast, in particular for a future making of a modular streetlamp mast and/or sensor hub mast. Furthermore, the connection frame is releasably connected to this first street mast module, wherein the housing parts extend to a height that lies above a height to which the first street mast module extends such that at least an upper portion of the first street mast module is surrounded by the housing parts. Furthermore, a removable first-type cover is provided, which first-type cover is configured to shield of an upper side of the housing parts including the upper end of the first street mast module.

Thus an attractive new option is provided for local authorities and decision makers for choosing where and how to have public service cabinets placed in the public area. They can now more easily choose to have the service cabinets placed there where they are most needed and there where they are most practical for their specific services without being limited to having to place them strictly as stand-alone units or strictly around already present street masts.

The service cabinets can now advantageously even be firstly placed as fully operational stand-alone units at locations where somewhere in the future also street masts are scheduled. As soon as that is desired, the cabinets then can fully remain being functional, operational, and in place. Merely its cover needs to be removed and replaced by another type, such that the cabinet, and in particular the first street mast module already located inside it and already firmly founded to the ground, can easily and quickly be expanded to an entire street mast.

As soon as somewhere in the future it is then desired to merely maintain the street mast and/or to have new types of modernized service cabinets placed, then this also can easily and quickly be done, simply by disassembly and removal or replacement of the cabinet while the entire street mast then can stay in place and maintain being fully functional and operational.

In a preferred embodiment a removable second-type cover can be provided that is destined to replace the first-type cover and that is configured to shield of the upper side of the cabinet while guiding through a lower portion of a second street mast module that has been connected to the upper end of the first street mast module. Thus two types of covers are provided with which the cabinet in an easy and efficient manner can be shielded at its upper side for such a period of time that is foreseen to have the cabinet used as a stand-alone unit as well as during a subsequent period of time in which it is foreseen to have the cabinet expanded with further street mast modules.

In another preferred embodiment the first street mast module may comprises an inlet opening at a side of or inside the ground for one or more ground cables, in particular for a public lighting grid cable, to enter into and extend through the first street mast module towards a sideways directed closable opening, which closable opening in particular may lie in line with an inlet opening that is provided inside the connection frame and/or housing parts and that connects to the one or more internal spaces. In addition thereto or in the alternative the connecting frame and/or housing parts may also comprise an inlet opening at a side of or inside the ground for one or more ground cables, in particular for a public electricity grid cable and/or communication cable, to enter into the cabinet, which inlet opening also connects to the one or more internal spaces. Inside the internal spaces again suitable connections, terminals, or the like, can be provided with which the cables can be connected.

Inside the internal spaces suitable connections, terminals, or the like, can be provided with which the cables can be connected. By making this provision, the stand-alone cabinet can be made fully operational and at a same time also be fully prepared and ready to be expanded at some point in time with the further street mast modules. Specific electrical and/or communication/control equipment that are going to be provided inside the internal spaces and/or mounted to or integrated with the further street mast modules, can easily and quickly be connected to the ground cables at the location of the easily accessible internal spaces. It is then also possible to immediately or later on have all kinds of safety measures, like fuses, and/or smart control options added to the electrical and/or communication/control equipment at the locations of their connections, terminals, or the like, inside the internal spaces.

By making this provision, one has a choice to either have the ground cables guided from out of a dug-in standpipe or the like directly into the internal spaces, or first have them extend through the first street mast module.

Furthermore, by not only having ground cables introduced into the internal spaces that are necessary for the cabinet to function as a stand-alone unit, but to also already do the same for ground cables that are required by the later on to be expanded street mast, the stand-alone cabinet is fully prepared and ready to be expanded at some point in time with the further street mast modules. At a same time this makes it possible to somewhere in the future have specific electrical and/or communication/control equipment added to the internal spaces and/or mounted to or integrated with the further street mast modules, and then have them easily and quickly made operational as well, by connecting them to the ground cables at the location of the easily accessible internal spaces. This also makes it possible to have all kinds of additional smart control options added to the electrical and/or communication/control equipment whenever this desired.

Preferably, important ones of the ground cables get to extend through the first street mast module. This has the advantage that should later on the first street mast module be expanded to a complete street mast, while also the cabinet would be removed, that the street mast then may remain being fully operational without dangerous electricity and/or vulnerable communication cables having to run around an outside of the aboveground portion of the first street mast module. The connections, terminals, or the like, then can easily be taken out of the internal spaces and placed via the closable opening inside the first street mast module itself, after which that opening can be closed with a suitable lid or capping.

The connecting frame may comprise a base-plate inside which the inlet opening is provided for the one or more ground cables to enter into the cabinet, which base-plate is configured to come to lie on or in the ground, in particular at a level underneath a pavement. Such a base-plate may even be fixedly connected to the first street mast module at the position at or below ground level. Thus a strong base-plate can be selected at that vulnerable position of the cabinet, which base-plate may help to protect the ground cables entering into the cabinet and may help to properly position the cabinet in its upwardly projecting orientation and, together with the foundation support, keep it neatly positioned during use.

In another preferred embodiment the connection frame can be releasably connected to the first street mast module by means of releasable connectors, in particular by means of one or more clamping brackets. In addition thereto the housing parts then may comprise one or more lockable cabinet doors that guard the releasable connectors against possible intruders, vandals, etc. that may try to damage or steal the cabinet.

In another preferred embodiment the connection frame may comprise a mounting rail that extends in a longitudinal direction alongside the upper portion of the first street mast module, and that is configured to connect one or more housing modules thereto each delimiting its own internal space. This makes the cabinet even more flexible in that over time housing modules can be changed for other ones, and/or a larger or smaller number of housing modules depending on the number of services the cabinet is destined to provide to users, maintenance personnel, city employees, etc.

The one or more housing modules in particular may comprise a plug-in charging module for electric vehicles and/or a mast control module and/or a city or municipality module.

Preferably each of the housing modules forms a closed compartment with an own dedicated lockable module door, which housing module all by itself is already well able to withstand all kinds of rough weather conditions.

In a preferred embodiment the cabinet is column-shaped and extends from the ground to a height above where the first street mast module ends such that the entire aboveground portion of the first street mast module is surrounded by the housing parts and can be shielded of by the first-type cover. This shall make the construction more robust, shall make it easier for the ground cables to be entered into the cabinet without first having to bridge a distance aboveground.

Further preferred embodiments are described herein.

The invention also relates to a method for installation of the public service cabinet.

BRIEF DESCRIPTION OF THE DRAWINGS

An example of the invention shall now be explained in more detail below with reference to the accompanying drawings, in which.

DETAILED DESCRIPTION OF THE INVENTION

In FIG. 1-11 a stepwise placing of a service cabinet as stand-alone unit, the option of subsequently expanding the service cabinet with a modular street mast, and finally the option of subsequently removing the public service cabinet while leaving behind the modular street mast, is shown. The entire service cabinet there has been indicated with the reference numeral 1, whereas the entire modular street mast has been indicated with the reference numeral 2.

Figure 1:
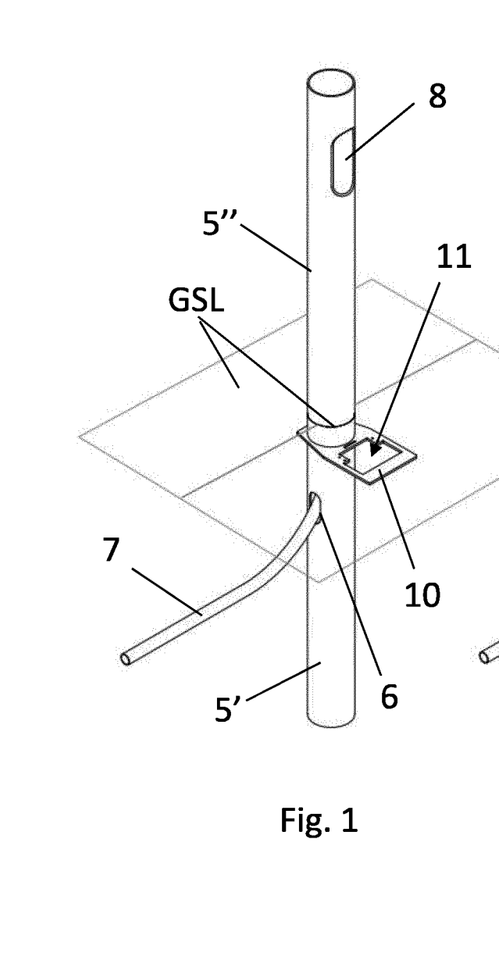
FIG. 1 shows a placing and founding of a first street mast module of an embodiment of a public service cabinet according to the invention.

In FIG. 1 it is shown that a foundation portion is formed entirely by a first street mast module 5 that here is formed by an elongate cylindrical hollow pole. A lower founding portion 5' of the pole is founded into the ground while an upper connection portion 5" projects upwardly in the vertical direction aboveground. The ground surface level GSL has been schematically indicated in FIG. 1 with a rectangular face and a line around the mast module 5.

The lower founding portion 5' is provided with a first inlet opening 6 into which a free end of a dug-in public lighting grid cable 7 is inserted. The upper connection portion 5" is provided with a closable opening 8 via which access can be obtained to the inside of the mast module 5 and in particular to the free end of the public lighting grid cable 7 that lies there.

Further it can be seen in FIG. 1 that a base-plate 10 is fixedly connected to the mast module 5 at the transition between the lower founding portion 5' and the upper connection portion 5". Inside the base-plate 10 a second inlet opening 11 is provided into which free ends of a public electricity grid cable 13 and a communication cable 14, here an internet cable, can be inserted (see FIG. 3).

Figure 2:
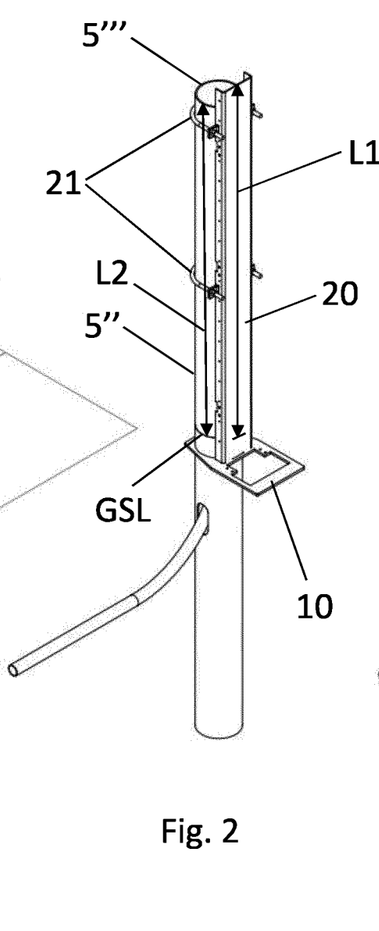
FIG. 2 shows a placing and connecting of a connection frame to the first street mast module.

In FIG. 2 it is shown that a connection frame 20 is connected to the upper connection portion 5" of the first street mast module 5. This is done by means of releasable connectors 21, here formed by two clamping brackets, one at an upper side and one in a middle of the frame 20. At its lower side the frame 20 is supported by and connected to the base-plate 10.

The frame 20 is formed by an elongate rail that extends parallel to the mast module 5 and comprises a large number of mounting holes along its length. The frame 20 extends with an upper part above the ground surface level GSL with a length L1 that is larger than a length L2 with which the upper connection portion 5" extends above the ground surface level GSL and thus extends upwardly to above a free upper end 5''' of the first street mast module 5.

Figure 3:
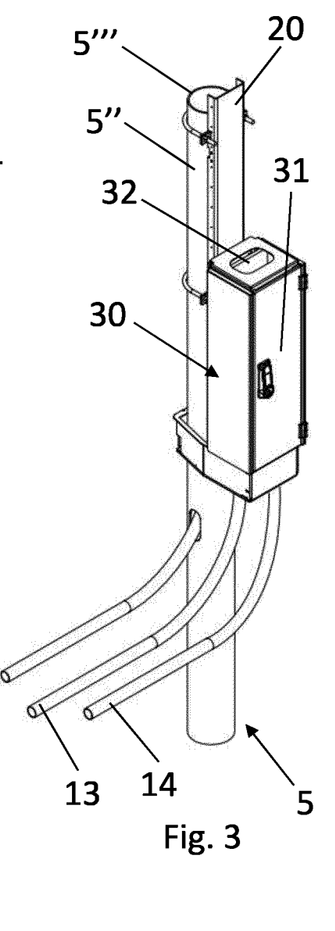
FIG. 3 shows a placing and connecting of a housing module to the connection frame.

In FIG. 3 it is shown that a first housing module 30 is connected to the frame 20 at a lowermost position where it is supported on top of the base-plate 10. The first housing module 30 is provided with a third inlet opening at its bottom side that lies in line with the second inlet opening 11 in the base-plate 10. Thus the public electricity grid cable 13 and the communication cable 14 can enter into the first housing module 30.

The first housing module 30 here forms a separate distinctive compartment with a bottom wall, opposing side walls, a back wall and a top wall. At its front side the compartment is closed off by a lockable module door 31. The compartment here is foreseen to be used as a city or municipality module that can be used by employees and maintenance personnel for storing all kinds of equipment, spare parts, maintenance schedules, and the like.

The top wall of the first housing module 30 is provided with an outlet opening 33 via which the public electricity grid cable 13 and the communication cable 14 can be guided towards other housing modules that get placed on top of it.

Figure 4:
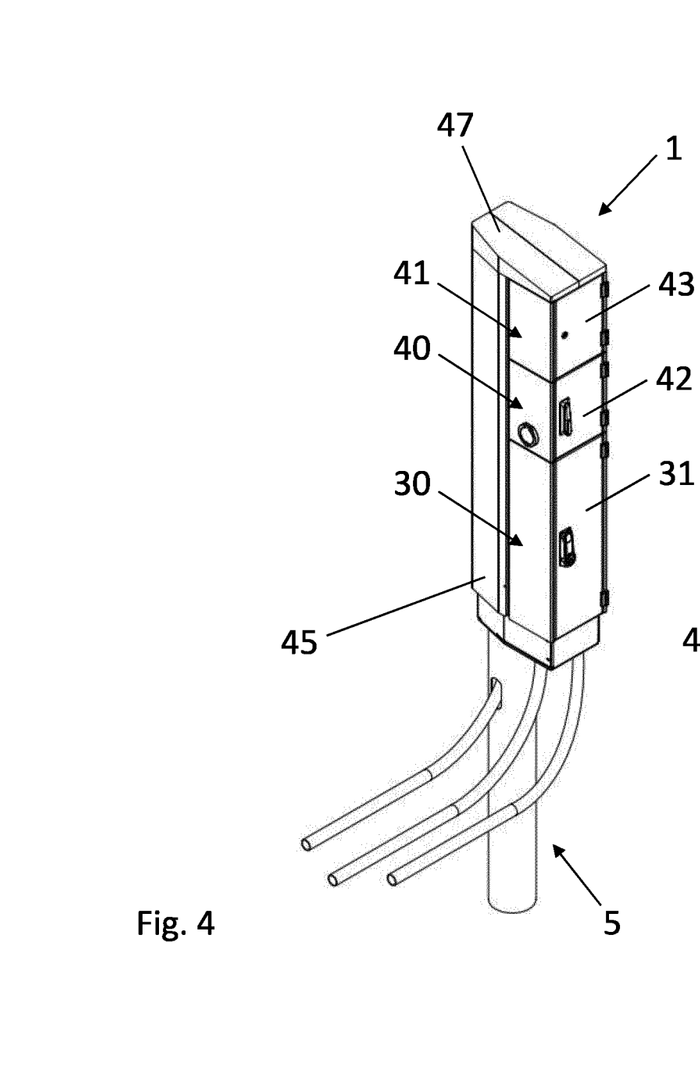
FIG. 4 shows a fully operational stand-alone cabinet with two further housing modules, backside cabinet doors and a two-part fully closed cover.

In FIG. 4 it is shown that a second and third housing module 40, 41 have been connected to the frame 20 at positions above the first housing module 30. The second and third housing modules 40, 41 also form separate distinctive compartments that at their front sides are closed off by their own lockable module door 42, 43.

The second housing module 40 here forms a plug-in charging module for electric vehicles, for which it is equipped with suitable electrical charging equipment that is connected to the public electricity grid cable 13 and with suitable communication/control equipment that is connected to the communication cable 14. Thus electric vehicles that are parked adjacent the cabinet 1 can be (re)charged while at a same time keeping track of the amount of electricity that gets loaded such that it can be send via the communication/control equipment to a controller that can take care that it gets paid for.

The third housing module 41 here forms a future mast control module, for which it can already be equipped with suitable connectors or terminals with which the public lighting grid cable 7 and/or with smart control means and/or with communication/control equipment with which the communication cable 14 can be connected. For that the frame 20 can be provided with a fourth inlet opening that lies in line with the closable opening 8 such that, after removal of a lid or capping, the free end of the public lighting grid cable 7 can be pulled out of the first street mast module 5 into the third housing module 41.

In FIG. 4 it can further be seen that, at a backside of the first street mast module 5, lockable cabinet doors 45 are provided that are mounted to the frame 20. The backside cabinet doors 45 lock off the entire backside of the cabinet 1.

A two part cover 47 is releasably connected to the upper side of the cabinet 1. With this an outer circumferential edge of the cover 47 here lies at a height level above the free upper end 5''' of the mast module 5 and in line with or around outer circumferential upper edges of the cabinet doors 45 as well as of the uppermost housing module 41 and thus shields of the entire upper side of the cabinet 1 including the free upper end 5''' of the first street mast module 5. Further it is noted that the upper side of the cover 47 is angled to the horizontal such that rain, snow, and the like, can easily wash of.

The thus properly placed and firmly founded cabinet 1 now is ready to be used as a stand-alone charging facility for electric vehicles.

The housing modules 30, 40, 41 are mounted to the mounting holes of the frame 20 by releasable connection elements, like bolts and nuts. Access to those bolts and nuts can only be obtained by authorized personnel after having opened the backside cabinet doors 45. Further it is noted that access to nuts of the releasable connectors 21 can only be obtained after having removed the housing modules 30, 40, 41. Thus a multi-stage anti-theft and anti-vandalism provision is created.

When at some point in time, which even may be years after the initial placing of the cabinet 1 as stand-alone unit, it becomes desired to have a street mast for provisions like a streetlamp, sensor hub, antenna, surveillance camera, weather station, solar panel, etc., erected at the location of the cabinet 1, then this can advantageously be done by expanding the first street mast module 5 inside the cabinet 1 with further street mast modules.

Figure 5:
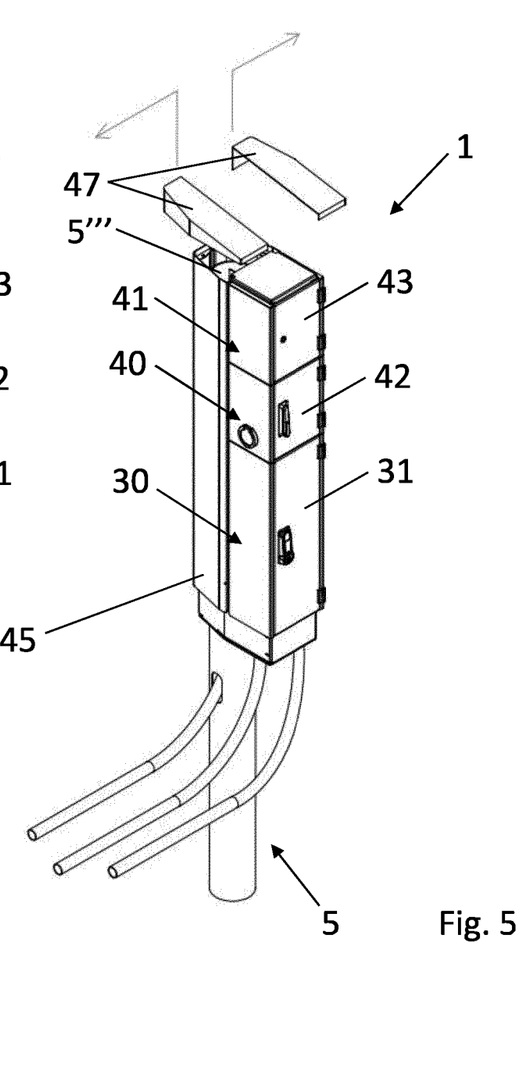
FIG. 5 shows a disconnecting and removing of the two part of the first-type cover.

In FIG. 5 it is shown that as a first step for this it is necessary to take off the cover 47 such that the free upper end 5''' of the already firmly founded first street mast module 5 becomes available.

The first street mast module 5 is configured and designed to not only form a reliable and strong foundation for the cabinet 1, and have the frame 20, the housing modules 30, 40, 41 and the other housing parts mounted to, but also to form part of the modular street mast 2. For that the free upper end 5' is configured to be connectable to a free lower end of a second street mast module 60 of the modular street mast 2. This can for example be done by means of the free upper end of the first street mast module being given a hollow female shape and by giving the free lower end of the second street mast module a somewhat smaller dimensioned complementary male shape that fits with a narrow sliding fit into the free upper end 5' of the first street mast module 5.

Figure 6:
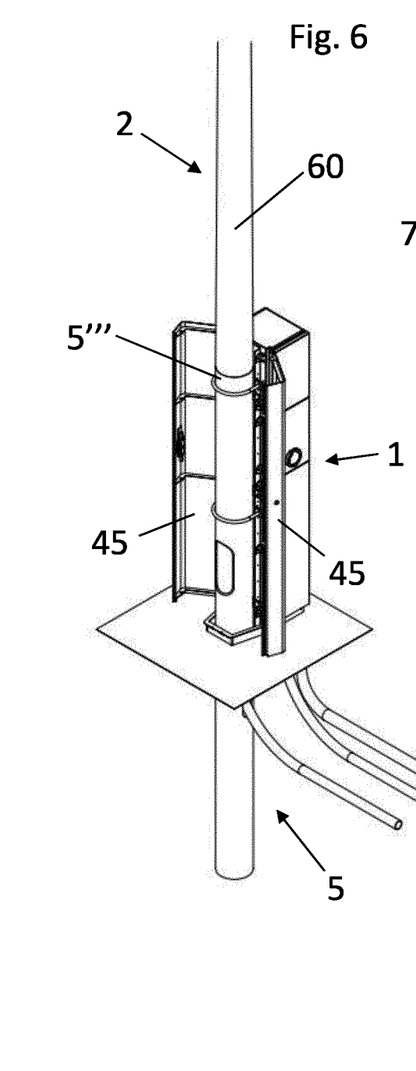
FIG. 6 shows an expansion of the first street mast module with a second street mast module, for which the backside cabinet doors have been temporarily opened.

In FIG. 6 it is shown that the backside cabinet doors 45 are temporarily opened such that the nesting fitting of the second street mast module 60 into and on top of the first street mast module 5 can be carefully guided.

Figures 7, 8:
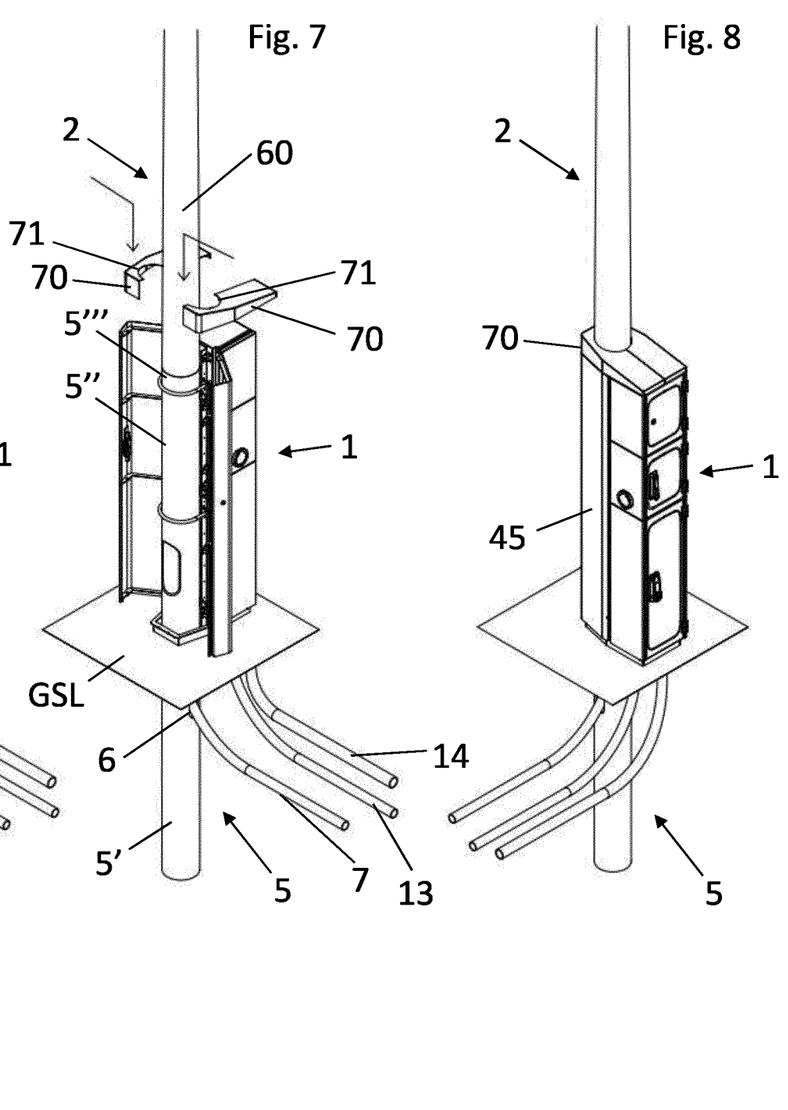
FIG. 7 shows a placing of a two-part mast hole cover around the second street mast module.
FIG. 8 shows the situation in which the mast hole cover is placed and with the cabinet doors closed again.

In FIG. 7 it is shown that another second type of two-part cover 70 is going to be placed on top of the cabinet 1. The two parts of this second type of cover 70 together delimit a mast hole 71 through which the second street mast module 60 can extend with a narrow, preferably fully sealing, fit. For the rest the parts of the cover 70 are constructed similar in shape to the ones of the first type closed cover 47.

In FIG. 8 it is shown that the cover 70 has indeed been placed and that the cabinet doors 45 have been closed and locked again.

Figures 9, 10:
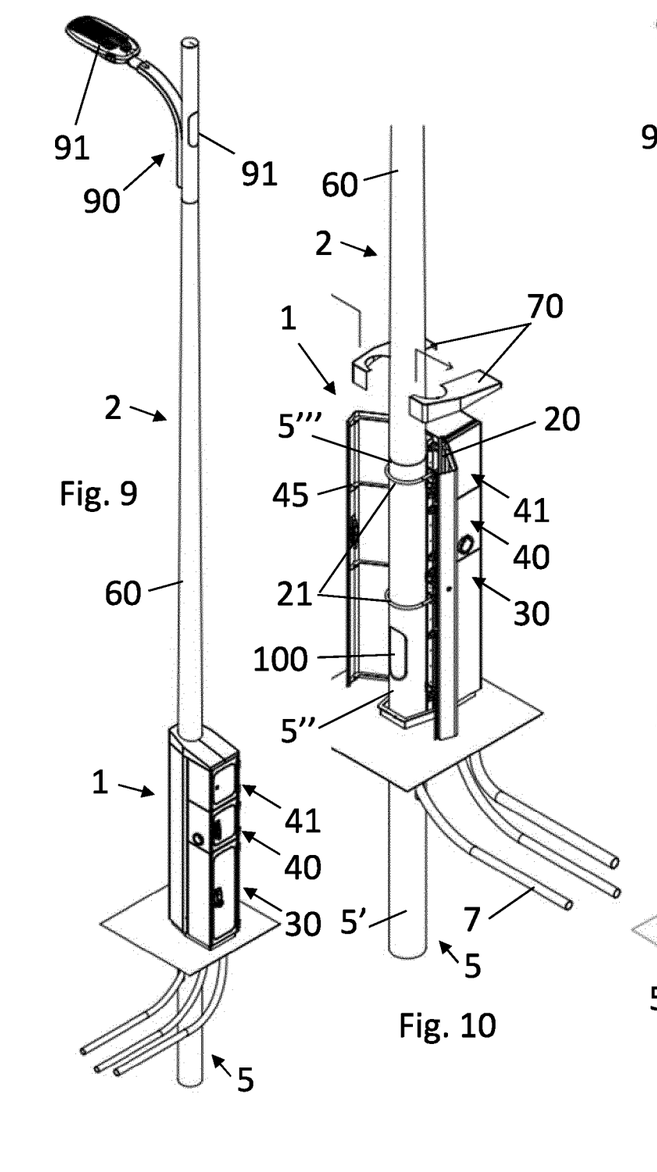
FIG. 9 shows a still fully operational cabinet expanded with further modular mast modules added to the street mast, including a fully operational streetlamp and sensor hub.
FIG. 10 shows a disconnecting of the two-part mast hole cover and opening of the backside cabinet doors for full disassembly and removal of the cabinet from around the street mast.

In FIG. 9 it is shown that a third street mast module 90, here provided with a streetlamp 91 and a sensor hub 92, has been connected to the free upper end of the second street mast module.

The streetlamp 91 and the sensor hub 92 can be connected to the public lighting grid cable 7 respectively the communication cable 14 inside the third housing module 41. The thus properly placed and firmly founded modular street mast 2 now is also ready to be used.

When at some point in time, which even may be years after the subsequent placing of the other street mast modules 60, 90, it becomes no longer desired to have the public service cabinet 1, then this can advantageously be done by having it disassembled from the modular street mast 2.

In FIG. 10 it is shown that as a first step for this it is necessary to take off the cover 70 and open the cabinet doors 45. Then the housing modules 30, 40, 41 can be dismounted and taken off, after which the connectors 21 can be released such that the frame 20 can be taken off.

The connection between the free end of the public lighting grid cable 7 and a cable extending through the second street mast module towards the streetlamp 91 of the third street mast module 90, then can be inserted back into the first street mast module 5 again after which the lid or capping can be placed to close the opening 8 again.

The connection between the free end of the communication cable 14 and a cable extending through the second street mast module towards the sensor hub 92 of the third street mast module 90, then can be inserted into an additional inlet opening 100 that is provided inside the upper connection portion 5'' of the first street mast module 5 at a location that initially was lying behind the cabinet doors 45 such that it could also be used for other operations and/or cables to be guided into the modular street mast.

Figure 11:
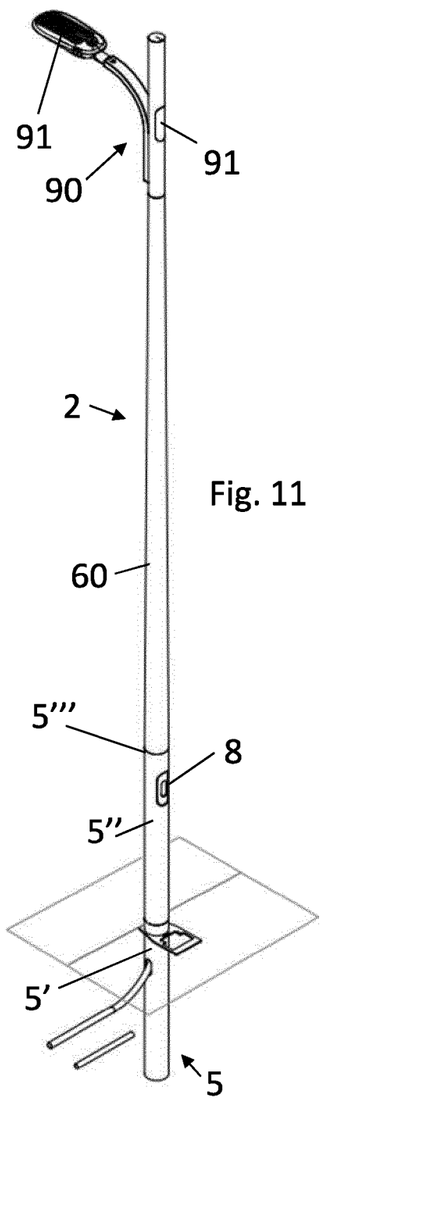
FIG. 11 shows the remaining modular street mast.

In FIG. 11 it is shown what then remains, that is to say the still fully operational street mast 2 with all of its facilities, but without the cabinet 1 around its first street mast module 5.

Besides the embodiments shown numerous variants are possible. For example the dimensions and shapes of the various parts can be altered. Also it is possible to make combinations between advantageous aspects of the shown embodiments. All kinds of materials can be used.

Instead of having the mast modules formed with cylindrical hollow cross-sections, other cross-sectional shapes are also possible, like for example polygonal shapes. Instead of making the mast modules with constant radial or width dimensions, they can also be made conical or stepped. Instead of nesting the free ends of the mast modules partly into each other, they can also be connected with each other in other ways.

Instead of having the foundation support formed as one single pole of which the upper portion gets inserted into the ground as foundation, it is also possible to make the foundation support with a distinctive lower foundation portion and upper connection portion. For example the lower foundation portion may also comprise a flange, plate, or the like, that is fixedly mounted to a lower end part of the upper connection portion. The upper connection portion then forms the first street mast module, whereas the lower foundation portion then is mountable to a concrete base or other belowground founding element. It is also possible for the foundation support to already comprise such a concrete base or other belowground founding element. The upper connection portion then again forms the first street mast module, whereas the lower foundation portion then is formed by the concrete base or other founding element that can be inserted into or buried in the ground.

Further it is noted that it is also possible to provide other shapes of housing parts and/or further types of covers that then can be designed with other shapes and dimensions of mast holes through which other types of second street mast module are able to extend with a narrow, preferably fully sealing, fit.

It should be understood that various changes and modifications to the presently preferred embodiments can be made without departing from the scope of the invention, and therefore will be apparent to those skilled in the art. It is therefore intended that such changes and modifications be covered by the appended claims.

The invention claimed is:

1. A public service cabinet, comprising:
a foundation support that is configured to be founded to the ground;
a connection frame that is connected with the foundation support; and
housing parts that are connected with the connection frame;
wherein the housing parts delimit one or more internal spaces for receiving electrical and/or communication/control equipment,
wherein the foundation support comprises a first street mast module of which an upper end is configured to be connectable to a lower end of a second street mast module of a modular street mast, in particular for a future expanding it with a modular streetlamp and/or sensor hub,
wherein the connection frame is releasably connected to the first street mast module,
wherein the housing parts extend to a height that lies above a height to which the first street mast module extends such that at least an upper portion of the first street mast module is surrounded by the housing parts, and
wherein a removable first-type cover is provided that is configured to shield of an upper side of the cabinet including the upper end of the first street mast module.

2. The public service cabinet according to claim 1, wherein a removable second-type cover is provided that is configured to shield of the upper side of the cabinet while guiding through a lower portion of a second street mast module after that has been connected to the upper end of the first street mast module.

3. The public service cabinet according to claim 1, wherein the first street mast module comprises an inlet opening at a side of or inside the ground for one or more ground cables, in particular for a public lighting grid cable, to enter into and extend through the first street mast module towards a sideways directed closable opening, which closable opening in particular may lie in line with an inlet opening that is provided inside the connection frame and/or housing parts and that connects to the one or more internal spaces.

4. The public service cabinet according to claim 1, wherein the connecting frame and/or housing parts comprise an inlet opening at a side of or inside the ground for one or more ground cables, in particular for a public electricity grid cable and/or communication cable, to enter into the cabinet, which inlet opening connects to the one or more internal spaces.

5. The public service cabinet according to claim 4, wherein the connecting frame comprises a base-plate inside which the inlet opening is provided for the one or more ground cables to enter into the cabinet, which base-plate is configured to come to lie on or in the ground, in particular at a level underneath a pavement.

6. The public service cabinet according to claim 5, wherein the base-plate is fixedly connected to the first street mast module.

7. The public service cabinet according to claim 1, wherein the connection frame is releasably connected to the first street mast module by means of releasable connectors, in particular by means of one or more clamping brackets, more in particular wherein the housing parts comprise one or more lockable cabinet doors that guard the releasable connectors.

8. The public service cabinet according to claim 1, wherein the connection frame comprises a mounting rail that extends in a longitudinal direction alongside the upper portion of the first street mast module, and that is configured to connect one or more housing modules of the housing parts thereto each delimiting its own internal space.

9. The public service cabinet according to claim 8, wherein the one or more housing modules with the electrical and/or communication/control equipment placed therein comprise one or more of the following:
a plug-in charging module for electric vehicles;
a mast control module;
a city or municipality module.

10. The public service cabinet according to claim 8, wherein each of the housing modules forms a closed compartment.

11. The public service cabinet according to claim 8, wherein each of the housing modules is provided with an own dedicated lockable module door.

12. The public service cabinet according to claim 1, wherein the cabinet is column-shaped and extends from the ground to the height that lies above the height to which the first street mast module extends such that an entire above-ground portion of the first street mast module is surrounded by the housing parts.

13. A method for installation of a public service cabinet according to claim 1, comprising the steps:
   founding the foundation support to the ground;
   connecting the connection frame with the first street mast module of the foundation support;
   connecting the housing parts, including placing electrical and/or communication/control equipment inside the one or more internal spaces, with the connection frame, such that at least the upper portion of the first street mast module is surrounded by the housing parts, and such that the housing parts extend to the height that lies above the height to which the first street mast module extends; and
   connecting the first-type cover such that it shields of the upper side of the cabinet including the upper end of the first street mast module.

14. The method according to claim 13, further comprising the steps:
   disconnecting and removing the first-type cover;
   connecting a second street mast module of a modular street mast to the upper end of the first street mast module, in particular for expanding it with a modular streetlamp or sensor hub;
   connecting a second-type cover that is configured to shield of the upper side of the cabinet while guiding through a lower portion of the second street mast module.

15. The method according to claim 14, further comprising the steps:
   disconnecting and removing the second-type cover;
   disconnecting and removing the housing parts, including the electrical and/or communication/control equipment inside the one or more internal spaces, from the connection frame;
   disconnecting and removing the connection frame from the first street mast module of the first street mast module.

* * * * *